United States Patent
Dando (10) Patent No.: US 6,687,969 B1
(45) Date of Patent: *Feb. 10, 2004

(54) METHODS OF FIXTURING FLEXIBLE SUBSTRATES AND METHODS OF PROCESSING FLEXIBLE SUBSTRATES

(75) Inventor: Ross S. Dando, Nampa, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 173 days.

(21) Appl. No.: 08/858,022

(22) Filed: May 16, 1997

(51) Int. Cl.⁷ .................. B23P 17/00; B23Q 7/00
(52) U.S. Cl. ............................ 29/423; 29/559
(58) Field of Search .................. 29/423, 559, 840, 29/739, 831, 900, 832, 833; 269/903, 286, 289 R, 302.1, 47, 94

(56) References Cited

U.S. PATENT DOCUMENTS

| | | | | |
|---|---|---|---|---|
| 2,825,558 A | * | 3/1958 | Devaud | ............ 271/2.3 |
| 2,923,651 A | | 2/1960 | Petriello | |

(List continued on next page.)

FOREIGN PATENT DOCUMENTS

| | | | | |
|---|---|---|---|---|
| DE | 41 23 370 A 1 | | 1/1993 | |
| DE | 195 49 354 A 1 | | 1/1997 | |
| GB | 2030779 A | | 4/1980 | |
| GB | 2253801 | * | 9/1992 | ........ 269/47 |
| JP | 56-61126 | * | 5/1981 | |
| JP | 2-226793 | * | 9/1990 | ........ 29/832 |
| JP | 03 262194 A | | 11/1991 | |
| JP | 3-262194 | * | 11/1991 | ........ 29/832 |
| JP | 3-281153 | * | 12/1991 | ........ 29/407 |
| JP | 04 220481 A | | 8/1992 | |
| JP | 4-342196 | * | 11/1992 | ........ 29/739 |
| JP | 05 017725 A | | 1/1993 | |
| JP | 6-112687 | * | 4/1994 | ........ 29/739 |
| JP | 07 022795 A | | 1/1995 | |
| JP | 07 188 621 A | | 7/1995 | |

OTHER PUBLICATIONS

"Adhesives," *The New Encyclopædia Britannica: MACROPZ70 DIA*, 15th ed., 1986, pp. 8–9.
Blake, Jeanne L., *Flexible Circuitry Design Guide*, Sheldahl, Inc., 1984, pp. 1–1–1–12; 2–1–2–20.
Perry, Thomas D., "Adhesives and Glues," [additional publication information unavailable].
International Search Report, International application No. PCT/US 98/ 10044 (5 pages).

*Primary Examiner*—P. W. Echols
(74) *Attorney, Agent, or Firm*—Wells St. John P.S.

(57) ABSTRACT

The present invention relates to methods of fixturing and processing flexible circuit substrates. Flexible circuit substrates are removably coupled with a processing carrier in certain aspects of the invention. Such coupling is preferably void of any adhesive. According to preferred embodiments of the present invention, the coupling surface is configured for reuse and a second flexible circuit substrate is positioned upon the coupling surface following the removal of the first flexible circuit substrate therefrom. Ideally, the coupling surface remains upon the processing carrier during the separation of a flexible circuit substrate from the coupling surface. One disclosed method of fixturing a flexible circuit substrate comprises: providing a processing carrier having a coupling surface, the coupling surface comprising silicone; positioning a flexible circuit substrate upon the coupling surface; and separating the flexible circuit substrate and the coupling surface while maintaining the coupling surface upon the processing carrier.

23 Claims, 7 Drawing Sheets

U.S. PATENT DOCUMENTS

| | | | |
|---|---|---|---|
| RE24,850 E | * 7/1960 | Devaud | 154/121 |
| 2,984,697 A | 5/1961 | Bontecue et al. | |
| 3,215,574 A | 11/1965 | Korb | |
| 3,255,047 A | 6/1966 | Escoffery | |
| 3,723,635 A | 3/1973 | Smith | |
| 3,781,596 A | 12/1973 | Galli et al. | |
| 3,818,279 A | 6/1974 | Seeger, Jr. et al. | |
| 3,892,614 A | * 7/1975 | Levy | 156/272 |
| 3,916,270 A | * 10/1975 | Wachtler et al. | |
| 4,066,177 A | * 1/1978 | Gidley et al. | |
| 4,075,420 A | 2/1978 | Walton | |
| 4,075,632 A | 2/1978 | Baldwin et al. | 343/6.8 |
| 4,154,998 A | * 5/1979 | Luft et al. | |
| 4,177,519 A | 12/1979 | Kasubuchi et al. | |
| 4,226,659 A | * 10/1980 | Griffith et al. | 29/834 |
| 4,258,508 A | * 3/1981 | Wilson et al. | |
| 4,681,654 A | 7/1987 | Clementi et al. | |
| 4,711,014 A | * 12/1987 | Althouse | 29/412 |
| 4,751,609 A | * 6/1988 | Kasahara | |
| 4,796,078 A | 1/1989 | Phelps, Jr. et al. | |
| 4,800,461 A | 1/1989 | Dixon et al. | |
| 4,871,155 A | * 10/1989 | Bievert et al. | |
| 4,926,182 A | 5/1990 | Ohta et al. | 342/44 |
| 5,032,438 A | 7/1991 | Sakumoto et al. | |
| 5,177,596 A | 1/1993 | Muramatsu et al. | |
| 5,177,863 A | 1/1993 | Lam | |
| 5,193,793 A | * 3/1993 | Pollock | |
| 5,206,795 A | * 4/1993 | Belanger, Jr. | 361/398 |
| 5,275,856 A | * 1/1994 | Calhoun et al. | 428/40 |
| 5,387,298 A | * 2/1995 | Takagi et al. | 29/900 |
| 5,413,360 A | * 5/1995 | Atari et al. | 279/128 |
| 5,452,140 A | 9/1995 | Kody | |
| 5,501,436 A | * 3/1996 | Miller | |
| 5,533,288 A | 7/1996 | Lambert | |
| 5,572,346 A | 11/1996 | Sakamoto et al. | |
| 5,621,412 A | 4/1997 | Sharpe et al. | 342/51 |
| 5,631,622 A | 5/1997 | Hauber et al. | |
| 5,638,249 A | * 6/1997 | Rubino et al. | |
| 5,649,296 A | 7/1997 | MacLellan et al. | 455/38.2 |
| 5,713,563 A | * 2/1998 | Chan | |
| 5,869,150 A | * 2/1999 | Iwamoto | 428/1 |

* cited by examiner

METHODS OF FIXTURING FLEXIBLE SUBSTRATES AND METHODS OF PROCESSING FLEXIBLE SUBSTRATES

TECHNICAL FIELD

The present invention relates to methods of fixturing and processing flexible circuit substrates.

BACKGROUND OF THE INVENTION

Flexible printed wiring has been utilized for many years by numerous industries. At first, flexible printed wiring was utilized in aerospace applications, and more recently, the flexible printed wiring has been implemented in many consumer products. Flexible printed wiring applications range from digital watches to commercial aircraft components, and from domestic appliances and automobiles to deep space hardware.

Flexible printed wiring provides inherent advantageous characteristics including: low weight and volume, increased reliability, flexibility and simplified assembly. Flexible printed wiring encompasses a random arrangement of printed conductors using a flexible insulating base or substrate material. A plurality of cover layers may be provided on the flexible substrate material.

The random arrangement of conductors distinguishes flexible printed wiring from collated, flat flexible cable. The capacity of flexible printed wiring circuits to bend requires that the conductors, adhesive, and cover layer materials utilized in the circuit be flexible similar to the base material.

Flexible printed wiring may comprise various combinations of base, conductor, and cover layers. For example, single-sided flexible printed wiring has conductors on one side of a base layer. Double-sided flexible printed wiring includes conductors on both sides of the base layer. Single access flexible printed wiring includes a given conductor layer accessible from an external connection on one side. Double access flexible printed wiring includes a conductor layer accessible via an external connection from either the conductor side or the base side thereof.

Multi-layer flexible printed wiring includes more than two conductor layers laminated together with insulating base layers between the conductive layers. Rigid-flex flexible printed wiring includes two or more rigid sections having one or more flexible sections provided therebetween. Rigidized flexible printed wiring includes a plurality of rigid sheet material pieces selectively bonded to the flexible printed wiring.

The utilization of a single flexible printed wiring array reduces the number of terminals and soldered joints required for combining component mounting areas with conventional interconnecting cables. Further, plated-through holes between conductored layers in flexible printed wiring are more reliable than the soldered joints and edge connectors which they can replace in conventional connection devices.

Beneficial characteristics of flexible printed wiring include inherent improved flexibility and lower mass per length which reduce strain on soldered joints. These characteristics of flexible printed wiring provide circuits of enhanced reliability compared to round wire when subjected to shocks and vibrations. Flexible printed wiring has increased resistance to damage and flexure when compared with conventional round wire because the conductor material can be positioned closer to the neutral surface and because the bond between the conductors and insulation is uniformly distributed over a larger area.

Flexible printed wiring typically requires special pallets or fixtures, commonly referred to as processing carriers, which are utilized to position and hold the flexible printed wiring terminals during component placement, mass soldering, and testing. These processing carriers essentially support the flexible sheets of material upon which the integrated circuitry is patterned, or traces are formed. The thin flexible sheets are subjected to various processing steps including large heating steps, air drying steps, and printing steps. The thin, flexible nature of the polyester films, makes it extremely difficult, if not impossible, for the flexible sheets to be processed without being received upon a rigid temporary substrate during manufacture.

Various methods and fasteners have been utilized to temporarily affix the flexible sheets to the processing carriers during the formation of the printed wiring thereon. One prior art method of attachment employs vacuum suction-like cups which are used to temporarily grasp portions of the backside of the flexible circuit substrate.

Alternately, bent pins have been utilized to hold the flexible substrate to the processing carrier. For example, upward pins may be provided at the edges of the flexible sheets. The upward pins may be bent over to grasp the outer surface of the flexible substrate to secure the flexible substrate for processing.

A plurality of holes may be provided within the flexible substrate for the sole purpose of facilitating the attachment of the flexible substrate to the processing carrier during the formation of the flexible printed wiring. Pins extend upwardly from the processing carrier through these holes. A plurality of securing devices, referred to as buttons, are positioned and pushed down upon the pins and onto the outer surface of the flexible substrate. The buttons are removed at the end of the processing of the flexible substrate.

Providing attachment through the use of such tooling pins makes certain processing steps impossible. For example, stencil printing of the flexible circuit is either difficult or impossible without damaging the stencil. Additionally, tooling is difficult to maintain when the tooling pins are utilized to secure the flexible circuit substrate.

In all of these prior art techniques, only some portion of the backside of the flexible sheet is actually retained or held fast to the processing carrier. Even where a screen is utilized as a support for a vacuum on the backside of the flexible substrate, an adhesive force is not provided at the portions where the screen physically touches the flexible substrate. In addition, the thin flexible circuits may "dimple" and stretch when vacuum is transmitted through a handling panel operating to hold the flexible circuit during processing.

Further, the utilization of a vacuum to hold the flexible circuit substrate may only be utilized at a single piece of processing equipment and may not be utilized to hold the substrate when the holding panel is transferred between various pieces of processing equipment.

One conventional technique for affixing the flexible circuit substrate to the processing carrier includes the external taping of corners of the upper surface of the substrate to the holding panel. However, such a method prevents processing of the portions of the substrate which are beneath the external tape. Further, such a method fails to prevent airflows created by the processing equipment (e.g., curing oven) from lifting an unrestrained area of the flexible circuit. Still further, taping of the corners of the substrate during certain processing steps, such as screen printing, is undesirable inasmuch as the film has a tendency to stick to the screen or stencil and lift upwards away from the rigid processing carrier.

In addition, further processing steps may not be immediately performed when the prior art methods of attachment are utilized. In particular, the outer surface of the flexible substrate sheets cannot be encapsulated on the processing carrier if prior art pins and\or external taping are utilized for affixing the flexible sheets. Specifically, the external tape attached to the top of the flexible substrate, or the pins protruding through the upper surface, or the buttons coupled with the pins, would be completely encapsulated precluding practical removal from the processing carriers.

Therefore, there exists a need for providing improved methods for securing flexible circuit substrates against the processing carrier during the formation of flexible printed wiring circuits.

SUMMARY OF THE INVENTION

Methods of fixturing flexible circuit substrates and methods of processing flexible circuit substrates are disclosed. In one implementation, a first flexible circuit substrate is positioned upon a coupling surface of the processing carrier. Flexible circuit substrates are removably coupled with the processing carrier. Such coupling is preferably void of any adhesive film. According to preferred embodiments of the present invention, the coupling surface is configured for reuse and a second flexible circuit substrate is positioned upon the coupling surface following the removal of the first flexible circuit substrate therefrom. Ideally, the coupling surface remains upon the processing carrier during the separation of a flexible circuit substrate from the coupling surface. In one aspect of the invention, a static electric coupling force at least in part removably retains the processing carrier and flexible circuit substrate. Further implementations of the present invention provide attaching a silicone substrate having a coupling surface to the processing carrier. Such implementations additionally provide for positioning a flexible circuit substrate upon the coupling surface and processing the flexible circuit substrate. The silicone substrate is preferably cleanable to reduce the presence of contaminants.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
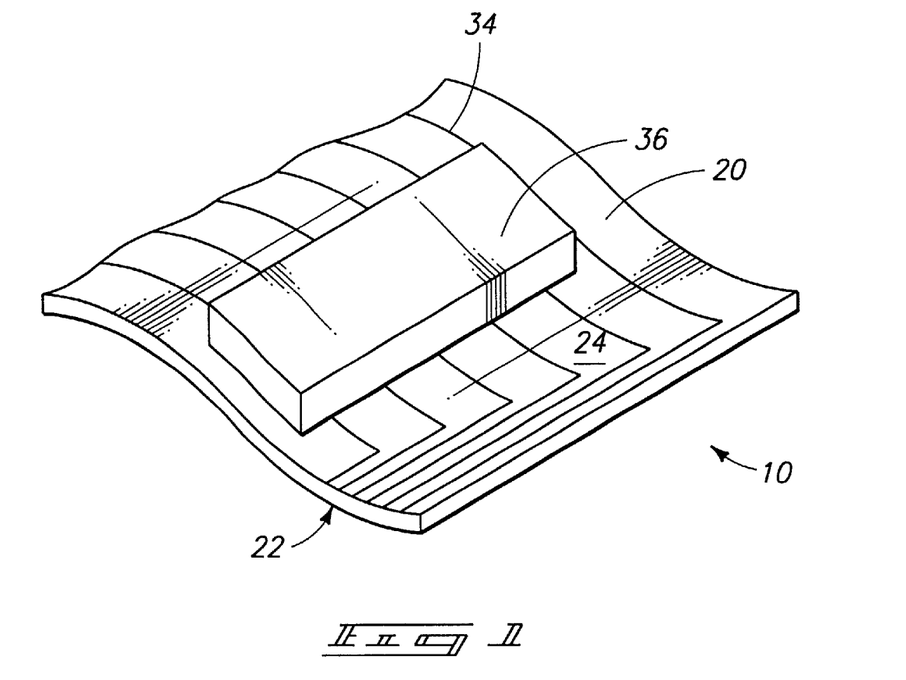
FIG. 1 is an isometric view of a flexible circuit having an integrated circuit chip mounted thereon.

Referring to FIG. 1, a processed flexible circuit 10 is shown. The illustrated flexible circuit 10 is a flexible printed wiring circuit. Although a preferred method is described herein with reference to a single-sided flexible circuit 10, the present invention is not limited to such circuits. The methods of the present invention may be utilized in the fabrication of any flexible circuit where fixturing of a flexible circuit substrate to a processing carrier is desired.

The flexible circuit 10 comprises a flexible circuit substrate 20 and a plurality of printed conductors 34 formed thereon for electrically coupling electrical components mounted thereto. The flexible circuit substrate 20 includes a first surface 22 (not specifically visible in FIG. 1) and a second surface 24 opposite thereto. The printed conductors 34 are formed on second surface 24. An exemplary integrated circuit chip 36 is mounted to the substrate 20 and operably connected with some of the conductors 34.

The flexible circuit substrate 20 preferably comprises a dielectric substrate which is the base film upon which the printed conductors 34 are formed providing electrical connections within the flexible circuit 10. The flexible circuit substrate 20 is operable to insulate printed conductors from one another, provide mechanical strength and permit flexing. The "flexible circuit substrate" as used herein refers to any flexible supporting or supportive structure, including, but not limited to, a supportive single layer of material or multiple layer constructions. For example, the flexible circuit substrate 20 may comprise polyester, polyamide, fluorocarbon, aramid paper, or a composite thereof. The flexible circuit substrate 20 preferably comprises a polyester film having a thickness of around 5 mils.

Figure 2:
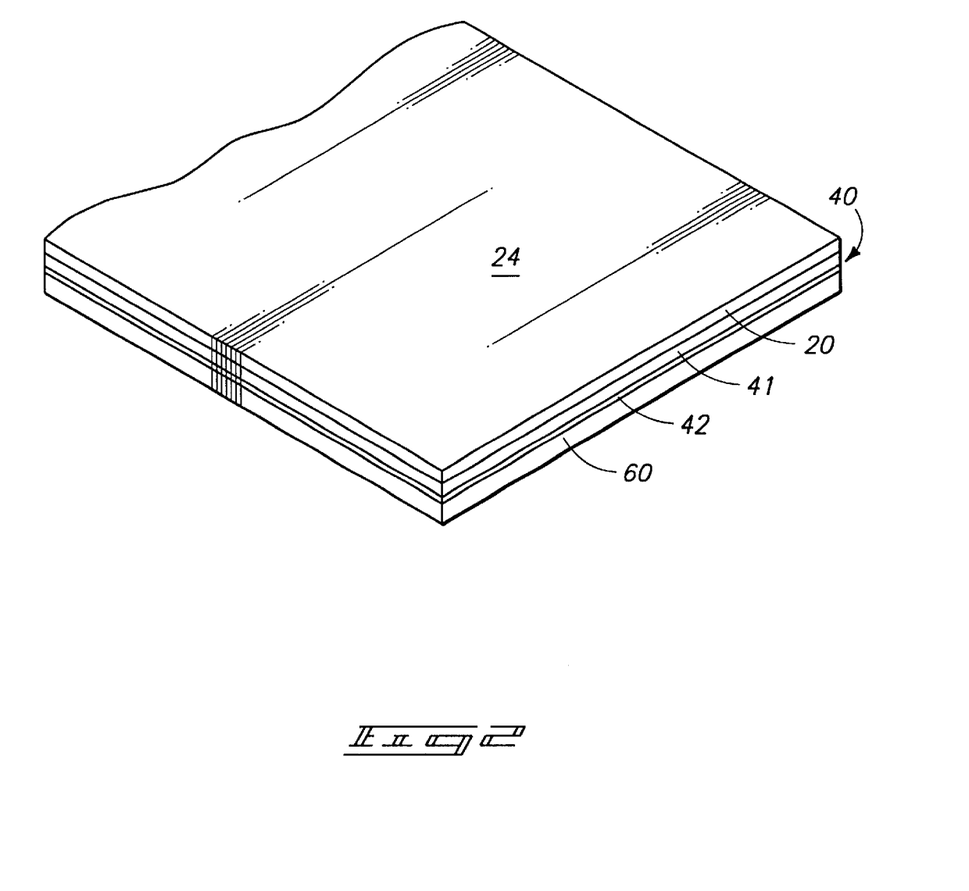
FIG. 2 is an isometric view of a flexible circuit substrate fixtured to a processing carrier with a coupling member provided therebetween.
Figure 3:
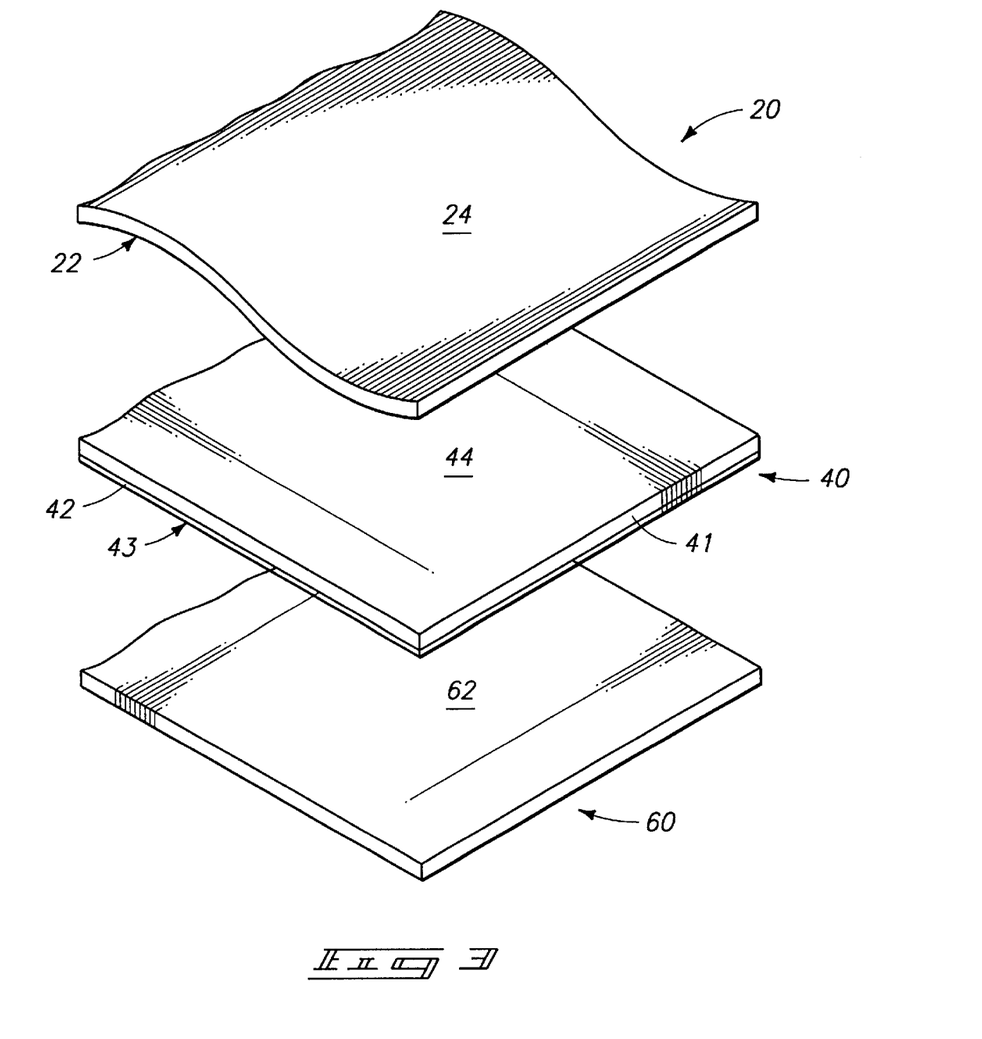
FIG. 3 is an exploded isometric view of FIG. 2.

Referring to FIG. 2 and FIG. 3, the flexible circuit substrate 20 is shown at a processing step prior to that depicted by FIG. 1. Specifically, the flexible circuit substrate 20 is adhered to a processing carrier 60, in the form of a rigid plate, with an intervening coupling member 40. Processing carrier 60 preferably comprises a flat, rigid material such as glass, metal plate, or a composite material panel. Processing carrier 60 includes an outer support surface 62 as shown in FIG. 3.

In one implementation of the present invention, coupling member 40 is a silicone tape comprising a silicone substrate 41 and a rubber based pressure sensitive adhesive layer 42. Silicone substrate 41 provides a silicone coupling surface 44. Adhesive layer 42 provides an adhesive surface 43 (not specifically visible in FIGS. 2, 3) opposite coupling surface 44. Although substrates of various thicknesses may be utilized, a preferred thickness of silicone substrate 41 of coupling member 40 is 10 mils.

Adhesive layer 42 is provided intermediate silicone substrate 41 and processing carrier 60. In one implementation of the present invention, adhesive layer 42 is attached to silicone substrate 41. Adhesive layer 42 is configured for attachment to support surface 62. Attachment of adhesive surface 43 to support surface 62 adheres silicone substrate 41 to processing carrier 60.

In one aspect of the present invention, coupling member 40 comprises Anti-Slip/Anti-Stick Tape 5461 provided by Minnesota Mining and Manufacturing Company of St. Paul, Minn. Tape 5461 provides a backing of PET film with a silicone rubber coating forming silicone substrate 41. Tape 5461 additionally provides a rubber adhesive forming adhesive layer 42. Utilization of Tape 5461 as coupling member 40 provides a low release (anti-stick), high co-efficient of friction (anti-slip) coupling surface 44 which consists essentially of silicone.

Coupling surface 44 is configured to removably couple the first surface 22 of flexible circuit substrate 20 and coupling member 40. The coupling of coupling surface 44 and first surface 22 forms a removable coupling of substantially the entire surface area of first surface 22 of flexible circuit substrate 20 and coupling surface 44 of silicone substrate 41 inherently upon contact therebetween.

Figure 4:
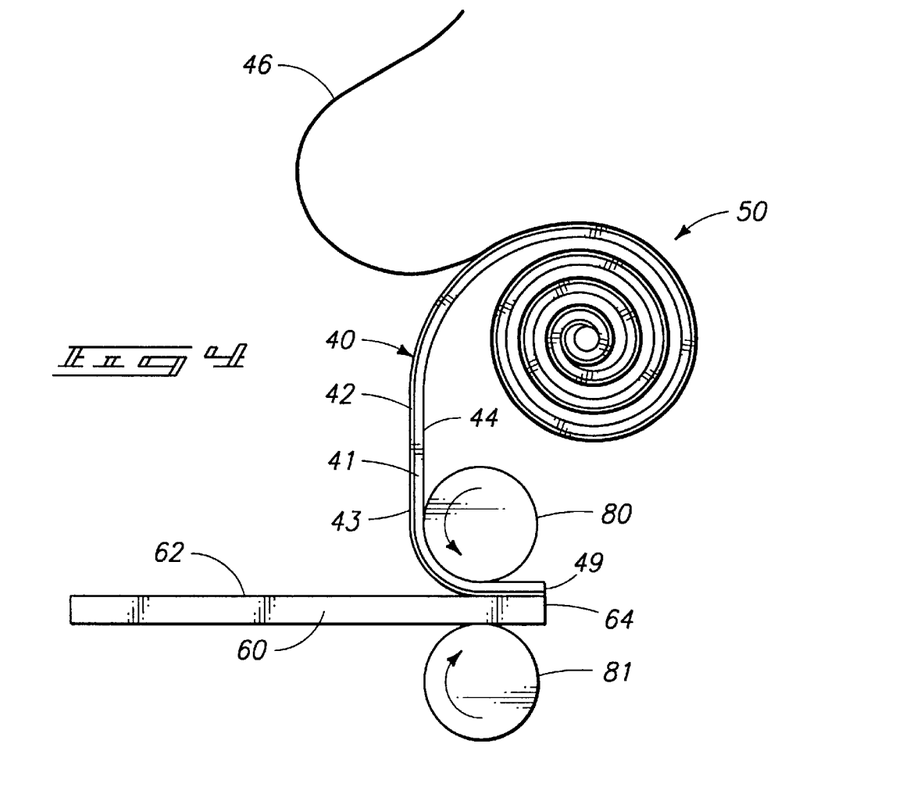
FIG. 4 shows a processing step of attaching the coupling member to the processing carrier.

Referring to FIG. 4, one method of attaching coupling member 40 to support surface 62 of processing carrier 60 is shown. Coupling member 40 is provided in the form of a roll 50. In one implementation of the present invention, a protective release liner 46 is provided to protect adhesive surface 43.

Coupling member 40 and processing carrier 60 have respective leading edges 49, 64. Release liner 46 is removed to expose adhesive surface 43. The leading edges 49, 64 are vertically aligned and leading edge 49 of coupling member 40 is touched to support surface 62 adjacent leading edge 64 thereof. The touching of leading edge 49 of coupling member 40 to processing carrier 60 adheres the portion of adhesive layer 42 adjacent leading edge 49 to the portion of support surface 62 adjacent leading edge 64.

Following the alignment and attachment of respective leading edges 49, 64, coupling member 40 is attached to the remainder of support surface 62 of processing carrier 60. Nip rollering is utilized in one implementation of the present invention to provide such attachment.

More specifically, leading edges 49, 64 of coupling member 40 and processing carrier 60 are passed adjacent at least one roller. Preferably, a pair of rollers 80, 81 are utilized in the depicted method to adhere coupling member 40 to processing carrier 60. In the preferred embodiment, coupling member 40 and processing carrier 60 are provided intermediate rollers 80, 81. Adhesive surface 43 is attached to support surface 62 as coupling member 40 and processing carrier 60 are drawn through rollers 80, 81.

Following the attachment of coupling member 40 to processing carrier 60, excess portions of the coupling member 40, including silicone substrate 41 and adhesive layer 42, are trimmed from the edges of processing carrier 60. Coupling member 40 preferably covers the entire support surface 62 of processing carrier 60.

Figure 5:
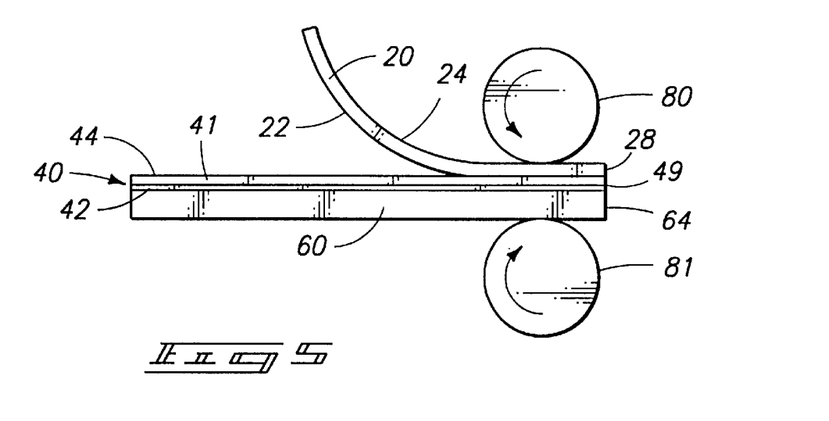
FIG. 5 shows a processing step of positioning the flexible circuit substrate upon the processing carrier.

Referring to FIG. 5, a method of coupling flexible circuit substrate 20 with processing carrier 60 is shown. The processing step depicted in FIG. 5 occurs subsequent to the attachment of coupling member 40 to processing carrier 60. Thereafter, a leading edge 28 of 14 flexible circuit substrate 20 is vertically aligned with respective leading edges 49, 64 of coupling member 40 and processing carrier 60. A portion of first surface 22 adjacent leading edge 28 is positioned to touch a portion of coupling surface 44 adjacent leading edge 49. In one implementation of the invention, approximately one inch of flexible circuit substrate 20 adjacent leading edge 28 is positioned upon coupling member 40.

Following the coupling of leading edges 28, 49, coupling surface 44 of member 40 is coupled with first surface 22 of flexible circuit substrate 20. Such coupling of surfaces 22, 44 couples flexible circuit substrate 20 with processing carrier 60. Carrier 60 and substrate 20 are preferably attached by nip rollering. In particular, carrier 60 and substrate 20 are drawn intermediate rollers 80, 81. Drawing processing carrier 60 having flexible circuit substrate 20 thereon intermediate rollers 80, 81 positions substrate 20 upon coupling member 40 and carrier 60.

The positioning of first surface 22 upon coupling surface 44 removably couples flexible circuit substrate 20 and processing carrier 60. In particular, substantially the entire surface area of first surface 22 of flexible circuit substrate 20 is individually coupled with coupling surface 44. The utilization of rollers 80, 81 to provide the coupling is preferred to minimize the formation of air pockets intermediate flexible circuit substrate 20 and processing carrier 60.

Coupling member 40, via silicone substrate 41, provides a removable coupling of flexible circuit substrate 20 and coupling surface 44. Such coupling of coupling member 40 and flexible circuit substrate 20 is ideally essentially void of any contributing adhesive film, and ideally neither coupling surface 44 or first surface 22 is adhesive (i.e., sticky or tacky) to the human finger touch. In the context of this document, an "adhesive" is a substance capable of holding certain materials together by some surface attachment mechanism that may involve mechanical or specific adhesion, and which can be categorized as any of thermoplastic, thermosetting, contact, hot-melt, pressure-sensitive or re-moistenable. Such coupling is believed to be achievable with silicone polymers where the material molecular weight exceeds about 50,000 AMU, although lower molecular weight silicone materials and other materials are expected to be useable. A static electric force is believed in significant part to provide the desired removable coupling of coupling member 40 and flexible circuit substrate 20. The predominate (i.e., greater than 50%) coupling force between the carrier 60 and substrate 20 may be static electric, and may consist essentially of a static electric force. Accordingly, at least one of first surface 22 and coupling surface 44 is capable of holding an electric charge. Yet, other attractive forces between the processing carrier and flexible substrate may exist. For example, one effective attractive force that may exist between the silicone surface and the flexible substrate is mechanical adhesion inherent from contact of the silicone (or other suitable substrate) with the flexible substrate, or by contact of the coupling surface and the flexible substrate with a material therebetween which is not an "adhesive" as defined herein, such as ambient moisture ($H_2O$).

In one aspect of the present invention, the coupling force is imparted to first surface 22. Thus, second surface 24 is ideally entirely outwardly exposed and void of fasteners (e.g., pins, buttons, tape and the like). Such enables processing of substantially the entire surface area of second surface 24 of flexible circuit substrate 20.

In accordance with the preferred embodiment of the present invention, coupling surface 44 provides a high coefficient of friction which acts to minimize slippage of flexible circuit substrate 20 upon coupling surface 44. However, coupling surface 44 also provides a low release surface which permits separation of flexible circuit substrate 20 from coupling surface 44, while maintaining adhesive surface 43 of coupling member 40 attached to the support surface 62 of processing carrier 60. Thus, coupling member 40 is reusable to couple a plurality of flexible circuit substrates.

Alternately, by way of example only, coupling member 40 could be provided pre-applied to flexible circuit substrate 20 prior to joining with processing carrier 60, or pre-applied to processing carrier 60 prior to joining with the flexible circuit substrate 20. Regardless, the fixtured flexible substrate is then subjected to various processing, such as the printing of circuit wiring 34 thereon and adhering electronic devices thereto. Such can ultimately include application of encapsulating material (described below) outwardly of flexible substrate surface 24 while fixtured to processing carrier 60 in the preferred embodiment, something heretofore not practically achievable. In the exemplary embodiment, no temporary fixturing materials or components are received over or project outwardly of substrate surface 24, enabling such encapsulation.

Figure 6:
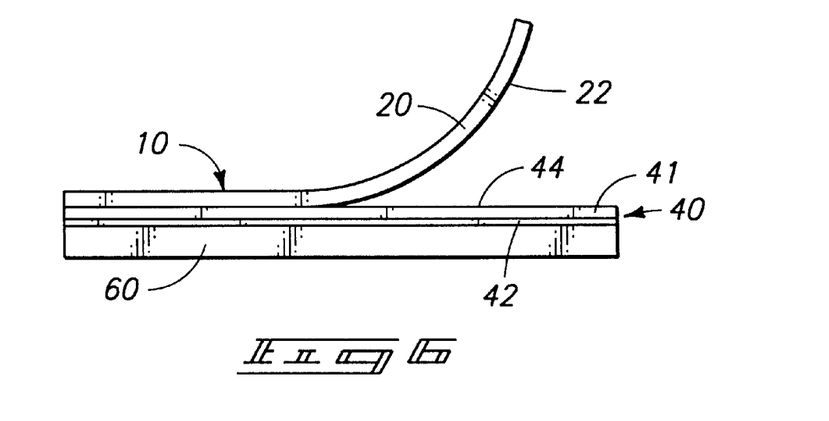
FIG. 6 shows a processing step of separating the flexible circuit substrate from the processing carrier.

Referring to FIG. 6, flexible circuit substrate 20 is subsequently separated from processing carrier 60 following the processing of flexible circuit 10. Preferably, coupling member 40 remains upon processing carrier 60 during the separation enabling reuse of coupling member 40 with a second flexible circuit substrate.

Figure 7:
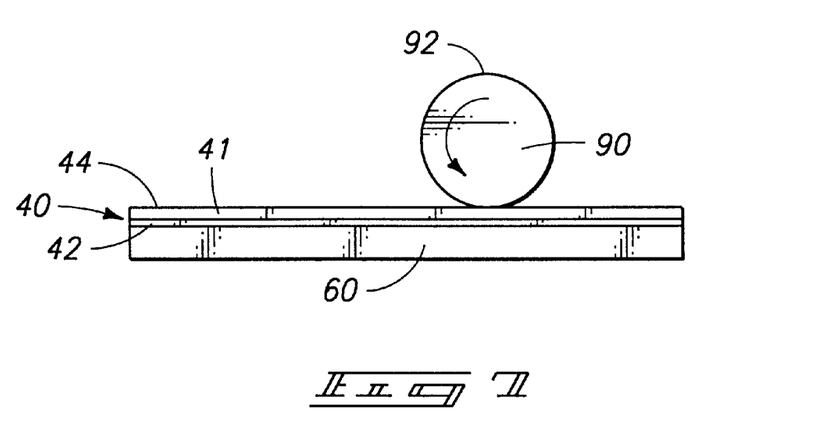
FIG. 7 shows a processing step of cleaning a coupling surface of the coupling member.
Figure 8:
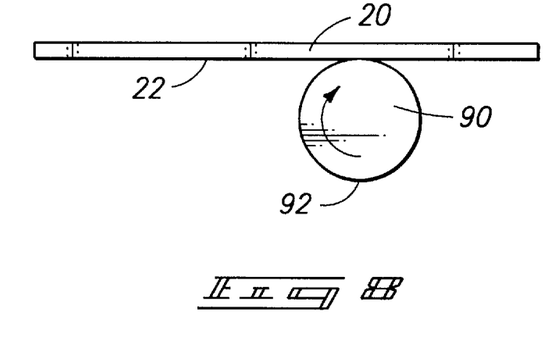
FIG. 8 shows a processing step of cleaning a first surface of the flexible circuit substrate.

Referring to FIG. 7 and FIG. 8, cleaning steps are performed during the fixturing of the flexible circuit substrates to reduce the presence of contaminants upon various surfaces. In particular, it is preferred to clean coupling surface 44 prior to the fixturing of flexible circuit substrate 20 thereto. Since coupling surface 44 allows reuse inasmuch as numerous flexible circuit substrates 20 may be attached to silicone substrate 41, it is preferred to clean coupling surface 44 intermediate the respective positionings of the flexible circuit substrates.

Referring to FIG. 7, one method of cleaning coupling surface 44 is shown. Processing carrier 60 is passed adjacent a cleaning roller 90 having an outer adhesive surface 92. Processing carrier 60 is positioned such that coupling surface 44 is in contact with outer adhesive surface 92. Outer adhesive surface 92 operates to remove contaminants from coupling surface 44 while maintaining the attachment of coupling member 40 and processing carrier 60 via adhesive layer 42.

Referring to FIG. 8, one method cleaning first surface 22 of flexible circuit substrate 20 is shown. Flexible circuit substrate 20 is passed adjacent cleaning roller 90. Substrate 20 is positioned such that first surface 22 is in contact with outer adhesive surface 92 of cleaning roller 90. Such passing of first surface 22 adjacent cleaning roller 92 operates to remove contaminants from first surface 22 of flexible circuit substrate 20. First surface 22 is preferably cleaned prior to the application thereof to coupling surface 44 of coupling member 40.

Similarly, support surface 62 of processing carrier 60 may be passed adjacent adhesive surface 92 of roller 90 prior to the attachment of coupling member 40 thereto. Such cleaning of support surface 62 reduces the presence of contaminants intermediate coupling member 40 and processing carrier 60.

Alternately considered, a cleansing agent, such as isopropyl alcohol, is applied to respective ones of coupling member 40, flexible circuit substrate 20 and processing carrier 60 to implement cleaning of respective first surface 22, coupling surface 44, and support surface 62. Surfaces 22, 44, 62 are subsequently wiped with a lint-free wipe in such embodiments following the applications of the cleansing agent.

The methods of fixturing the flexible circuit substrate 20 to the processing carrier 60 in accordance with the preferred embodiment provide numerous benefits. First, the processing carrier 60 may be transferred from one piece of process equipment to another without having to remove the flexible circuit substrate 20 attached thereto. Fixturing of the flexible circuit substrate 20 to the processing carrier 60 with coupling member 40 prevents dimpling or stretching of flexible circuit substrate 20. Further, coupling member 40 affixes substantially, the total surface area of the first surface 22 of flexible circuit substrate 20 to processing carrier 60. The coupling member 40 ideally holds the flexible circuit substrate 20 uniformly across substantially the entire first surface 22 thereof.

Attachment of the total surface of the flexible circuit substrate 20 to the processing carrier 60 during processing prevents the flexible circuit substrate 20 from being raised during certain processing steps, including blowing of air against the flexible circuit substrate 20. Additionally, attaching substantially the total surface area of the flexible circuit substrate 20 to the processing carrier 60 eliminates the tendency of the flexible circuit 10 to attach to the stencil or screen and lift apart from the processing carrier 60 during stencil or screen printing.

Fixturing of the flexible circuit substrate 20 to the processing carrier 60 by the disclosed methods permits unobstructed processing of the unattached surface (i.e., the second surface 24) of the flexible circuit substrate 20. Such methods may be tailored for compatibility with the specific processing carrier 60 being utilized, the flexible circuit 10 materials, and the processing environment.

The utilization of coupling member 40 having a silicone coupling surface 44 provides additional advantages. In particular, flexible circuit substrates may be typically removed from processing carrier 60 without damaging the coupling member 40 provided therebetween, and using readily available processing equipment. Therefore, coupling member 40 having coupling surface 44 may be reused to couple a plurality of individual flexible circuit substrates to the processing carrier 60.

Although coupling surface 44 provides a low release surface, flexible circuit substrates 20 have been found to remain coupled with processing carrier 60 during a variety of processing steps utilized in the fabrication of flexible circuit 10. Such processing steps include exposure to ultraviolet light and high temperatures ranging from 22° C. to 300° C.

Further exemplary utilization of the above technology is described with reference to FIG. 9 through FIG. 11. The flexible circuit substrate 20 is processed to define a plurality of individual devices 21, which will ultimately be singulated from substrate 20. Example devices include RFID cards. The flexible circuit substrate 20 is placed in a stencil or other printer in which conductive epoxy is applied thereover following the fixturing of the flexible circuit substrate 20 to the processing carrier 60.

Figure 10:
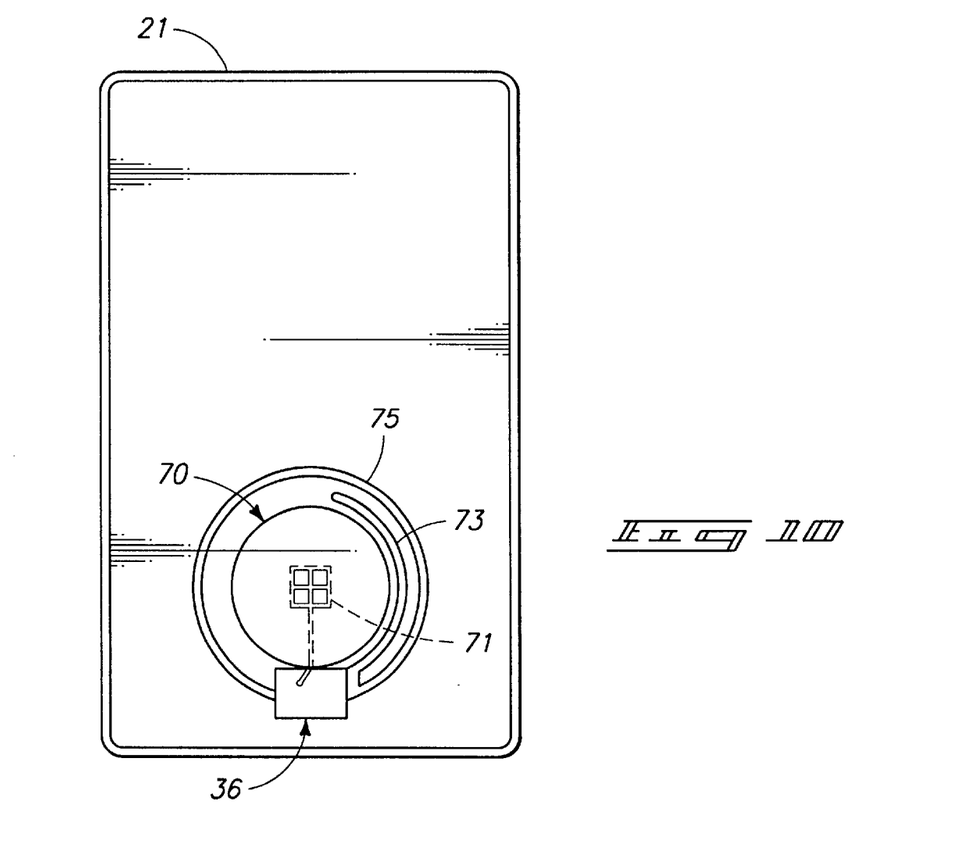
FIG. 10 is a top view of one of the individual patterns of FIG. 9.
Figure 11:
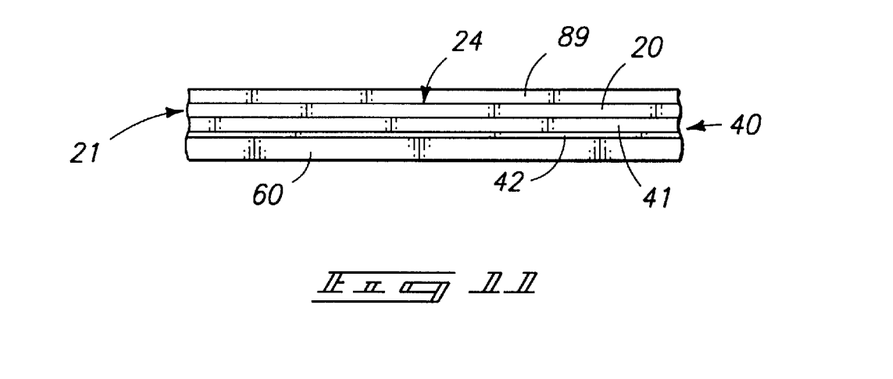
FIG. 11 is a cross-sectional view which shows various elevational layers of the device shown in FIG. 10 at an intermediate processing step.

FIG. 10 illustrates exemplary circuitry of an individual RFID device 21. Such includes circuitry in the form of a first battery connection terminal 71, a second battery connection terminal 73 and an antenna 75. A thin profile/button-type battery 70 is mounted on each of the individual substrates 21 with conductive epoxy.

An integrated circuit 36 is provided and includes suitable circuitry including transponder circuitry for receiving, processing, transmitting and/or otherwise operating upon electronic signals. Integrated circuit 36 is preferably in the form of a semiconductor chip which is operatively mounted relative to the individual substrate 21 and in electrical contact with battery 70 via a conductive ink as described in a U.S. Patent Application entitled "Methods Of Enhancing Electromagnetic Radiation Properties Of Encapsulated Circuit, And Related Device", filed the same day as the present application by Mark E. Tuttle and Rickie C. Lake as named inventors, and commonly assigned to the assignee hereof, and incorporated herein by reference. An exemplary and preferred integrated circuit 36 is described in U.S. patent application Ser. No. 08/705,043, which names James O'Toole, John R. Tuttle, Mark E. Tuttle, Tyler Lowrey, Kevin Devereaux, George Pax, Brian Higgins, Shu-Sun Yu, David Ovard and Robert Rotzoll as inventors, which was filed on Aug. 29, 1996, is assigned to the assignee of this patent application, and is incorporated herein by reference.

Figure 9:
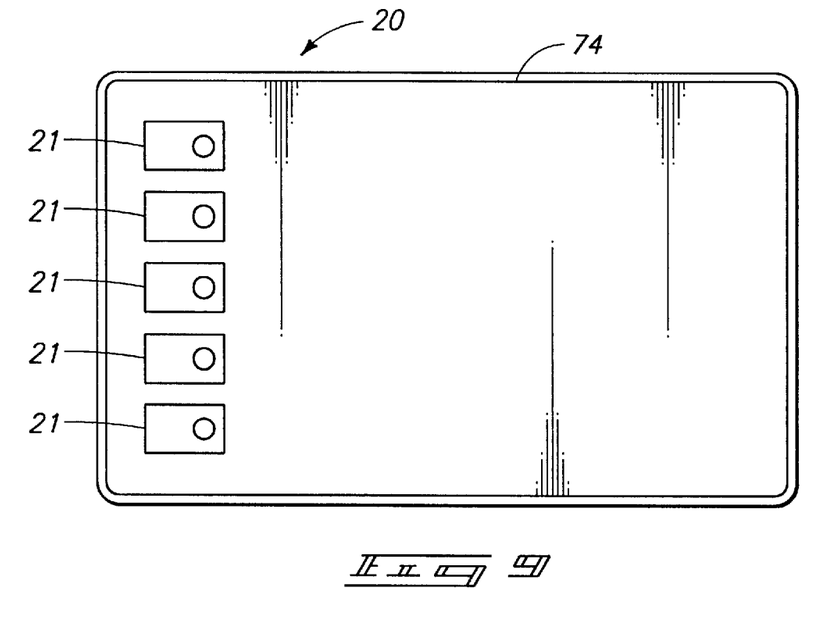
FIG. 9 is a top plan view of the flexible circuit substrate having a plurality of discrete patterns, and which is fixtured to a processing carrier.

Referring to FIG. 9, flexible circuit substrate 20 undergoes further processing in which an amount of adhesive material 74 is applied around a perimeter edge of the sheet or panel. Such applied adhesive material forms a dam relative to and inside of which encapsulating epoxy material is to be formed.

Subsequently, encapsulating epoxy material 89 (shown in FIG. 11) is formed over the flexible circuit substrate surface 24 to cover/encapsulate each of individual devices 21 while the processing carrier 60 is in place. Preferably, such epoxy constitutes a two-part epoxy having a resin and a hardener which are sufficient to provide desired degrees of flex and rigidity. After application and curing of such epoxy, the processing carrier 60 and coupling member 40 are removed and the flexible circuit substrate 20 is subjected to suitable separation or singulation processing in which individual devices 21 are cut and separated from one another.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of processing a flexible substrate comprising:
    providing a processing carrier having a silicone-comprising surface;
    providing a flexible substrate having a pair of opposing surfaces, the opposing surfaces being a first surface and a second surface;
    cleaning the first surface of the flexible substrate;
    adhering the first surface of the flexible substrate to the silicone-comprising surface of the processing carrier after the cleaning; and
    processing the second surface of the flexible substrate while the first surface of the flexible substrate is adhered with the silicone-comprising surface of the processing carrier.

2. The method of claim 1 wherein the flexible substrate comprises polyester.

3. The method of claim 1 wherein the silicone-comprising surface consists essentially of silicone.

4. The method of claim 1 wherein the adhering comprises adhering substantially an entirety of the first surface of the flexible substrate with the silicone-comprising surface.

5. The method of claim 1 further comprising cleaning the silicone-comprising surface prior to adhering the first surface of the flexible substrate to the silicone-comprising surface.

6. The method of claim 1 further comprising:
    after the processing, removing the flexible substrate from the silicone-comprising surface;
    after removing the flexible substrate, adhering another flexible substrate to the silicone-comprising surface, said other flexible substrate having a first surface contacting the silicone-comprising surface and a second surface opposing the first surface; and
    processing the second surface of the other flexible substrate while the first surface of the other flexible substrate is adhered with the silicone-comprising surface of the processing carrier.

7. A method of processing a flexible substrate comprising:
    providing a processing carrier having a surface;
    providing a coupling member having an adhesive layer and a silicone-comprising surface;
    first adhering the adhesive layer of the coupling member with the surface of the processing carrier;
    providing a flexible substrate having a pair of opposing surfaces, the opposing surfaces being a first surface and a second surface;
    second adhering the first surface of the flexible substrate to the silicone-comprising surface of the coupling member after the first adhering; and
    processing the second surface of the flexible substrate while the first surface of the flexible substrate is adhered with the silicone-comprising surface of the processing carrier.

8. The method of claim 7 wherein the flexible substrate comprises polyester.

9. The method of claim 7 wherein the silicone-comprising surface consists essentially of silicone.

10. The method of claim 7 wherein the second adhering comprises adhering substantially an entirety of the first surface of the flexible substrate with the silicone-comprising surface.

11. The method of claim 7 further comprising cleaning the first surface of the flexible substrate prior to adhering the first surface to the silicone-comprising surface.

12. The method of claim 7 further comprising cleaning the silicone-comprising surface prior to adhering the first surface of the flexible substrate to the silicone-comprising surface.

13. The method of claim 7 further comprising:
    after the processing, removing the flexible substrate from the silicone-comprising surface;
    after removing the flexible substrate, adhering another flexible substrate to the silicone-comprising surface, said other flexible substrate having a first surface contacting the silicone-comprising surface and a second surface opposing the first surface; and
    processing the second surface of the other flexible substrate while the first surface of the other flexible substrate is adhered with the silicone-comprising surface of the processing carrier.

14. A method of fixturing a flexible substrate comprising:
    providing a processing carrier having a surface;
    providing a coupling member having a silicone-comprising surface;
    first applying the coupling member to the surface of the processing carrier using a roller leaving the silicone-comprising surface outwardly exposed;
    providing a flexible substrate having a surface; and
    second applying the surface of the flexible substrate to the silicone-comprising surface of the coupling member after the first applying.

15. The method of claim 14 wherein the silicone-comprising surface consists essentially of silicone.

16. The method of claim 14 wherein the adhering comprises adhering substantially an entirety of the surface of the flexible substrate with the silicone-comprising surface.

17. The method of claim 14 further comprising cleaning the surface of the flexible substrate prior to adhering the surface to the silicone-comprising surface.

18. The method of claim 14 further comprising cleaning the silicone-comprising surface prior to adhering the surface of the flexible substrate to the silicone-comprising surface.

19. A method of fixturing a flexible substrate comprising:
 providing a processing carrier having a silicone-comprising surface;
 providing a flexible substrate having a surface;
 cleaning the surface of the flexible substrate; and
 adhering the surface of the flexible substrate to the silicone-comprising surface of the processing carrier after the cleaning.

20. A method of fixturing a flexible substrate comprising:
 providing a processing carrier having a surface;
 first cleaning the surface of the processing carrier;
 providing a coupling member having an adhesive layer and a silicone comprising surface;
 first adhering the adhesive layer of the coupling member with the surface of the processing carrier using a roller after the first cleaning;
 providing a flexible substrate having a surface;
 second cleaning the surface of the flexible substrate; and
 second adhering the surface of the flexible substrate to the silicone-comprising surface of the coupling member after the first adhering and the second cleaning.

21. The method according to claim 20 wherein the adhesive layer of the coupling member comprises a rubber based pressure sensitive adhesive layer.

22. The method according to claim 20 wherein the first and second cleanings individually comprise using a cleansing roller.

23. The method according to claim 20 wherein the first and second cleanings individually comprise using a cleansing agent.

* * * * *

UNITED STATES PATENT AND TRADEMARK OFFICE
CERTIFICATE OF CORRECTION

PATENT NO. : 6,687,969 B1
DATED : February 10, 2004
INVENTOR(S) : Ross S. Dando

It is certified that error appears in the above-identified patent and that said Letters Patent is hereby corrected as shown below:

Column 5,
Line 60, replace "Thereafter, a leading edge 28 of 14 flexible circuit substrate" with
-- Thereafter, a leading edge 28 of flexible circuit substrate --

Signed and Sealed this

Fourth Day of January, 2005

JON W. DUDAS
*Director of the United States Patent and Trademark Office*